United States Patent
Jang et al.

(10) Patent No.: US 9,356,191 B2
(45) Date of Patent: May 31, 2016

(54) EPITAXIAL LAYER WAFER HAVING VOID FOR SEPARATING GROWTH SUBSTRATE THEREFROM AND SEMICONDUCTOR DEVICE FABRICATED USING THE SAME

(71) Applicant: SEOUL VIOSYS CO., LTD., Ansan-si (KR)

(72) Inventors: Jong Min Jang, Ansan-si (KR); Kyu Ho Lee, Ansan-si (KR); Chang Suk Han, Ansan-si (KR); Hwa Mok Kim, Ansan-si (KR); Daewoong Suh, Ansan-si (KR); Chi Hyun In, Ansan-si (KR); Jong Hyeon Chae, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 0 days.

(21) Appl. No.: 14/726,031

(22) Filed: May 29, 2015

(65) Prior Publication Data
US 2015/0295132 A1    Oct. 15, 2015

Related U.S. Application Data

(62) Division of application No. 14/105,919, filed on Dec. 13, 2013, now Pat. No. 9,059,012.

(30) Foreign Application Priority Data

Dec. 14, 2012 (KR) .......................... 10-2012-0146329
Dec. 21, 2012 (KR) .......................... 10-2012-0150389

(51) Int. Cl.
*H01L 33/22* (2010.01)
*H01L 21/02* (2006.01)
(Continued)

(52) U.S. Cl.
CPC ............ *H01L 33/22* (2013.01); *H01L 21/0237* (2013.01); *H01L 21/0254* (2013.01); *H01L 21/02458* (2013.01); *H01L 21/02639* (2013.01); *H01L 21/02647* (2013.01); *H01L 29/0657* (2013.01); *H01L 33/0079* (2013.01); *H01L33/20* (2013.01); *H01L 33/24* (2013.01); *H01L 33/32* (2013.01); *H01L 33/0095* (2013.01)

(58) Field of Classification Search
CPC ................................ H01L 33/22; H01L 21/02
See application file for complete search history.

(56) References Cited

U.S. PATENT DOCUMENTS 6,303,405 B1 * 10/2001 Yoshida et al. ................. 438/46
2001/0053618 A1    12/2001 Kozaki et al.
(Continued)

FOREIGN PATENT DOCUMENTS

EP        0 942 459        9/1999
JP        2002-261032      9/2002

OTHER PUBLICATIONS

European Search Report dated Jan. 31, 2014 for EP Application No. 13 19 6850.
(Continued)

*Primary Examiner* — Marc Armand
(74) *Attorney, Agent, or Firm* — H.C. Park & Associates, PLC

(57) ABSTRACT

An epitaxial wafer includes a growth substrate, a mask pattern disposed on the growth substrate and comprising a masking region and an opening region, and an epitaxial layer covering the mask pattern and including a first void disposed on the masking region. The first void includes a lower void disposed between a lower surface of the epitaxial layer and the masking region, and an upper void extending from the lower void into the epitaxial layer, the lower void having a greater width than the upper void.

11 Claims, 13 Drawing Sheets

(51) Int. Cl.
*H01L 29/06* (2006.01)
*H01L 33/00* (2010.01)
*H01L 33/20* (2010.01)
*H01L 33/24* (2010.01)
*H01L 33/32* (2010.01)

(56) References Cited

U.S. PATENT DOCUMENTS

2009/0290610 A1 11/2009 Eichler et al.
2010/0062551 A1 3/2010 Chen et al.
2013/0143394 A1* 6/2013 Faurie et al. .................. 438/479

OTHER PUBLICATIONS

M. Mynbaeva, et al., "GaN and AlN Layers Grown by Nano Epitaxial Lateral Overgrowth Technique on Porous Substrates"; Materials Research Society symposium proceedings Fall 1999 (2000); pp. W2.7.1-W2.7.6; http://tdl.libra.titech.ac.jp/journaldocs/recordID/article.bib-01/ZR000000180224.

Notice of Allowance issued on Mar. 31, 2015, in U.S. Appl. No. 14/105,919.

* cited by examiner

EPITAXIAL LAYER WAFER HAVING VOID FOR SEPARATING GROWTH SUBSTRATE THEREFROM AND SEMICONDUCTOR DEVICE FABRICATED USING THE SAME

CROSS-REFERENCE TO RELATED APPLICATIONS

This application is a divisional of U.S. patent application Ser. No. 14/105,919, filed on Dec. 13, 2013, and claims priority from and the benefit of Korean Patent Application No. 10-2012-0146329, filed on Dec. 14, 2012, and Korean Patent Application No. 10-2012-0150389, filed on Dec. 21, 2012, which are all hereby incorporated by reference for all purposes as if fully set forth herein.

BACKGROUND

1. Field

The present invention relates to an epitaxial wafer that has a void between an epitaxial layer and the growth substrate, to allow easy separation of the growth substrate from the is epitaxial layer, a method of fabricating the same, a method of separating a substrate using the epitaxial wafer, a semiconductor device, and a method of fabricating the same.

2. Discussion of the Background

As an inorganic semiconductor light emitting diode, a vertical light emitting diode has been developed. Vertical light emitting diodes employ a support substrate having good heat dissipation properties and are fabricated by growing an epitaxial layer on a growth substrate, and separating the growth substrate from the epitaxial layer, in order to increase luminous output.

Vertical light emitting diodes have a larger light emitting area per chip and a higher internal quantum efficiency, due to having a higher heat dissipation efficiency than typical lateral-type light emitting diodes (lateral LEDs). In addition, vertical light emitting diodes allow for easy surface texturing of a light emitting face, thereby facilitating the improvement of light extraction efficiency.

For fabrication of vertical light emitting diodes, various methods for separating a growth substrate are known in the art. In particular, a substrate separation method based on laser lift-off (LLO), chemical lift-off (CLO), or stress lift-off (SLO), have attracted attention.

However, substrate separation methods based on laser lift-off require expensive equipment and also have the following other problems. First, since a laser beam of high energy is applied to an epitaxial layer, cracks can be generated in the epitaxial layer. In addition, since a laser beam is radiated through the growth substrate, it is generally necessary to have a large energy band-gap between the growth substrate and the epitaxial layer. Accordingly, when the growth substrate and the epitaxial layer are made of a homogeneous material, there is substantially no difference in energy band-gap therebetween, thereby making it difficult to separate the growth substrate from the epitaxial layer by laser lift-off. For example, when a is gallium nitride-based epitaxial layer is grown on a gallium nitride substrate, it is difficult to separate the epitaxial layer using laser lift-off.

In a chemical lift-off substrate separation method, a void is formed between the growth substrate and the epitaxial layer, and a chemical solution is introduced into the void to perform chemical etching of a predetermined region between the growth substrate and the epitaxial layer.

In a stress lift-off substrate separation method, a void is formed between the growth substrate and the epitaxial layer, to decrease a coupling force between the epitaxial layer and the growth substrate, and stress is applied to the void to separate the substrate from the epitaxial layer.

As compared with laser lift-off, chemical lift-off or stress lift-off can prevent damage to the epitaxial layer and can also be applied when the growth substrate and the epitaxial layer are made of a homogeneous material. In order to use chemical lift-off or stress lift-off, it is generally necessary to form a relatively large void between the growth substrate and the epitaxial layer.

SUMMARY

Aspects of the present invention provide an epitaxial wafer having a relatively large void between a growth substrate and an epitaxial layer, to allow application of chemical lift-off or stress lift-off methods, and a method of fabricating the same.

In addition, aspects of the present invention provide a method of separating a growth substrate from an epitaxial layer by forming a relatively large void between the growth substrate and the epitaxial layer, and a method of fabricating a semiconductor device using the is same.

Further, aspects of the present invention provide a method of separating a substrate and a method of fabricating a semiconductor device, in which an epitaxial layer grown on a growth substrate can be separated from the growth substrate without being divided.

Further, aspects of the present invention provide a novel light emitting diode having improved light extraction efficiency.

Additional features of the invention will be set forth in the description which follows, and in part will be apparent from the description, or may be learned by practice of the invention.

In accordance with one aspect of the invention, an epitaxial wafer comprises: a growth substrate; a mask pattern disposed on the growth substrate and comprising a masking region and an opening region; and an epitaxial layer covering the mask pattern. In addition, the epitaxial layer comprises a void disposed on the masking region.

In accordance with another aspect of the present invention, a method of fabricating an epitaxial wafer comprises: preparing a growth substrate; forming a mask pattern having a masking region and an opening region on the growth substrate; and growing an epitaxial layer on the growth substrate having the mask pattern to cover the mask pattern. Here, the epitaxial layer comprises a void on the masking region.

In accordance with a further embodiment of the present invention, a method of separating a substrate comprises: preparing a growth substrate; forming a mask pattern having a masking region and an opening region on the growth substrate; growing an epitaxial layer on the growth substrate having mask pattern to cover the mask pattern, the epitaxial layer including a void on the masking region; and separating the growth substrate from the epitaxial layer. Since is the void is formed in the epitaxial layer on the masking region, the growth substrate can be easily separated from the epitaxial layer by application of stress lift-off or chemical lift-off using the void.

In accordance with yet another aspect of the present invention, a method of fabricating a semiconductor device comprises the method of separating a substrate as described above. In accordance with yet another aspect of the present invention, a light emitting diode comprises: a support substrate; a semiconductor stack structure disposed on the support substrate and comprising an active layer; protrusions and recesses formed on an upper surface of the semiconductor stack structure; and rough surface areas formed on the protrusions and the recesses. The recesses have a width ranging from 5 μm to 30 μm.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION OF THE ILLUSTRATED EMBODIMENTS

Figure 1:
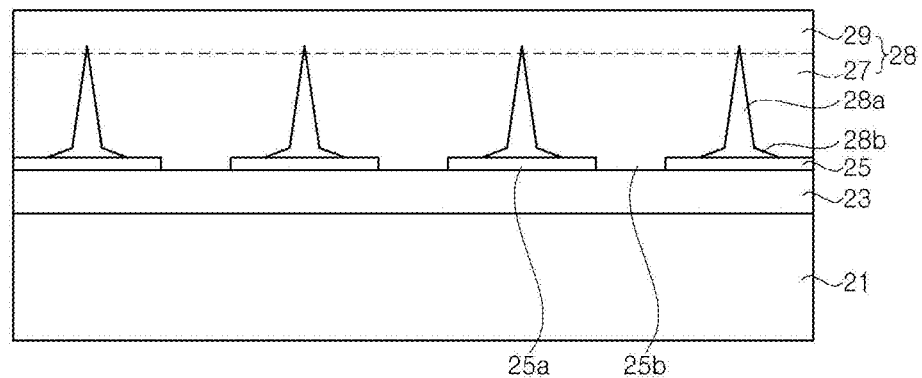
FIG. 1 is a sectional view of an epitaxial wafer in accordance with an exemplary embodiment of the present invention.

Embodiments of the present invention will be described in more detail with reference to the accompanying drawings. It should be understood that the following embodiments are given by way of illustration only to provide thorough understanding of the is invention to those skilled in the art. Therefore, the present invention is not limited to the following embodiments and may be embodied in different ways. Further, like components will be denoted by like reference numerals throughout the specification, and the widths, lengths, and thicknesses of certain elements, layers or features may be exaggerated for clarity.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

FIG. 1 is a sectional view of an epitaxial wafer in accordance with an exemplary embodiment of the present invention. Referring to FIG. 1, the epitaxial wafer comprises a growth substrate 21, a mask pattern 25, and an epitaxial layer 28. In addition, the epitaxial wafer may comprise a lower epitaxial layer 23. As used herein, the term "epitaxial wafer" means a wafer comprising a growth substrate and an epitaxial layer grown on the growth substrate, particularly, a wafer comprising an epitaxial layer to be separated from the growth substrate.

For the growth substrate 21, any substrate may be used so long as the substrate can be used to grow a gallium nitride-based semiconductor layer. For example, the growth substrate 21 may be a sapphire substrate, a gallium nitride substrate, an aluminum nitride substrate, a spinel substrate, a silicon carbide substrate, a silicon substrate, or the like. In addition, the growth substrate 21 may be a substrate for growth of a polar gallium nitride-based semiconductor layer, or a substrate for growth of a non-polar or semi-polar gallium nitride-based semiconductor layer.

The lower epitaxial layer 23 may comprise an undoped or n-type gallium nitride-based semiconductor layer. The lower epitaxial layer 23 is used in the case where the growth substrate 21 is a heterogeneous substrate, and may be omitted in the case where the growth substrate 21 is a gallium nitride substrate.

Figure 5:
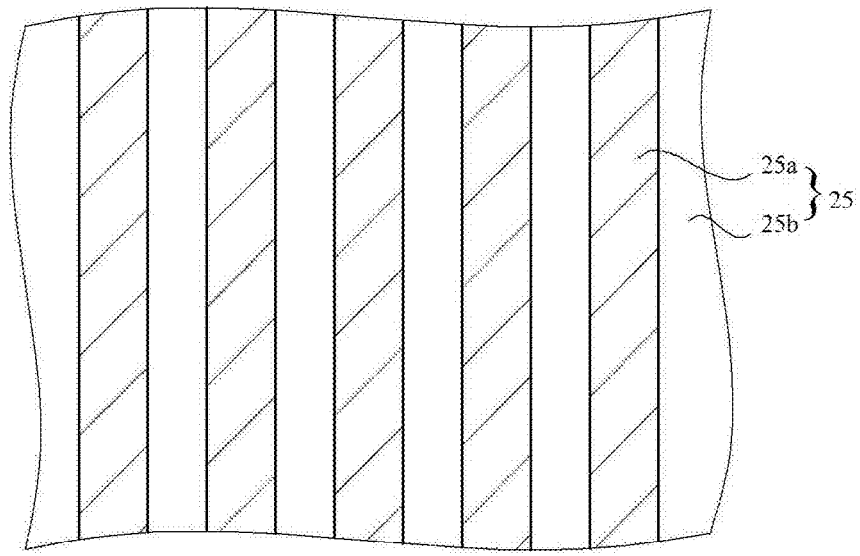
FIGS. 5(a), 5(b), 6(a), 6(b) 7(a), and 7(b) are top views of exemplary mask patterns in accordance with exemplary embodiments the present invention.
Figure 5:
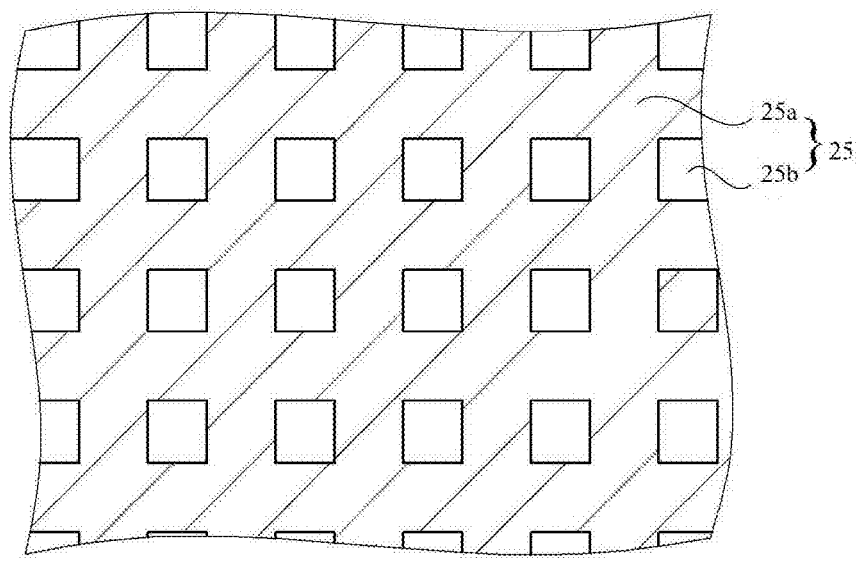
Figure 6:
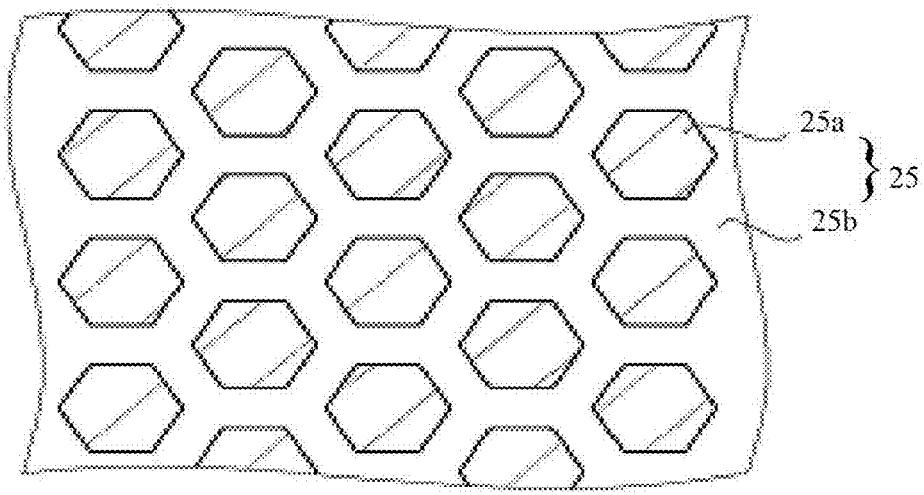
Figure 6:
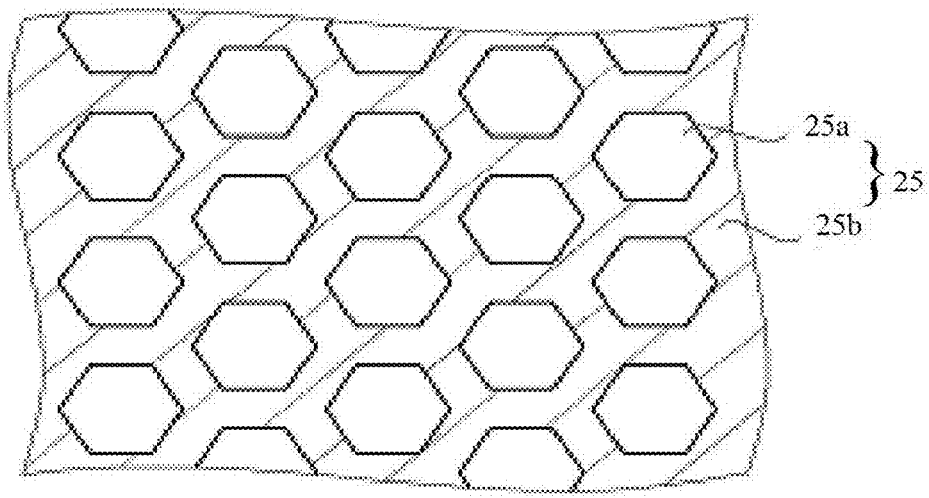

The mask pattern 25 is disposed on the growth substrate 21. When the lower epitaxial layer 23 is formed on the growth substrate 21, the mask pattern 25 may be disposed on the lower epitaxial layer 23. The mask pattern 25 may be formed of $SiO_2$, but is not limited thereto. The mask pattern 25 may be a stripe pattern, but is not limited thereto. Alternatively, the mask pattern 25 may be a mesh pattern or an island pattern. The mask pattern 25 will be described below with reference to FIG. 5 to FIG. 7.

The mask pattern 25 comprises a masking region 25a and an opening region 25b. In this embodiment, the masking region may have a width from 5 μm to 30 μm, specifically from 10 μm to 30 μm. In addition, the opening region may have a width of 1 μm to less than 3 μm.

Since the masking region 25a has a width of 5 μm or more, or a width of 10 μm or more, voids 28a, 28b may be formed to a relatively large size on the masking region 25a. In addition, since the opening region 25b has a width of less than 3 μm, the epitaxial layer 28 can be easily separated from the growth substrate 21 through the application of stress.

The epitaxial layer 28 covers the mask pattern 25. The epitaxial layer 28 may have a flat upper surface. The epitaxial layer 28 may comprise a gallium nitride-based semiconductor layer, for example, an undoped GaN or n-type GaN layer. Here, the epitaxial layer 28 may comprise a 3D epitaxial layer 27 grown under 3D growth conditions, and a 2D epitaxial layer 29 disposed on the 3D epitaxial layer 27 and connected thereto. The 3D epitaxial layer 27 may comprise an undoped GaN layer, and the 2D epitaxial layer 29 may comprise an n-type GaN layer.

The epitaxial layer 28 has voids disposed on the masking region. Here, the voids may be disposed in a limited area disposed on the masking region, and may comprise an upper void 28a and a lower void 28b. The upper void 28a is formed in an elongated shape in a thickness direction of the epitaxial layer 28, and is disposed on the lower void 28b. The upper void 28a may have a gradually decreasing width from bottom to top. The lower void 28b is disposed between the epitaxial layer 28 and the masking region, under the upper void 28a. The lower void 28b may have a gentler slope than the upper void 28a. In addition, the lower void 28b may have a width which is greater than the height thereof.

The epitaxial layer 28 can be easily separated from the growth substrate 21 by applying a chemical solution, such as HF or BOE (Buffered Oxide Etchant), into the upper and lower voids 28a, 28b to remove the masking region 25a. In addition, since the upper and lower voids 28a, 28b weaken a coupling force between the epitaxial layer 28 and the mask pattern 25, the epitaxial layer 28 can be easily separated from the growth substrate 21 by stress. Furthermore, since the lower void 28b is formed in a sharp shape between the masking region 25a and the epitaxial layer 28, the epitaxial layer 28 can be easily separated from the masking region 25a by applying stress to an interface therebetween.

The epitaxial wafer may further comprise a semiconductor stack structure (not shown) disposed on the epitaxial layer 28. The semiconductor stack structure may comprise various semiconductor layers, for example, gallium nitride-based semiconductor layers. The semiconductor stack structure may be used to fabricate various semiconductor devices, such as light emitting diodes, transistors, and the like.

The epitaxial wafer comprises the epitaxial layer 28, which has the voids 28a, 28b disposed on the masking region. Thus, the epitaxial layer 28 can be easily separated from the growth substrate 21 by chemical lift-off or stress lift-off processes, using the voids 28a, 28b.

Figure 2:
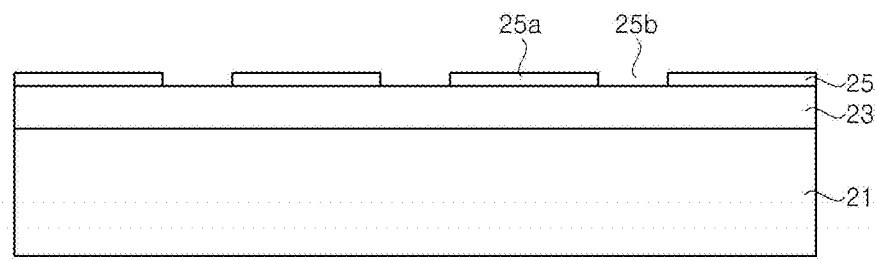
FIGS. 2 to 4 are sectional views illustrating a method of fabricating an epitaxial wafer in accordance with an exemplary embodiment of the present invention.
Figure 3:
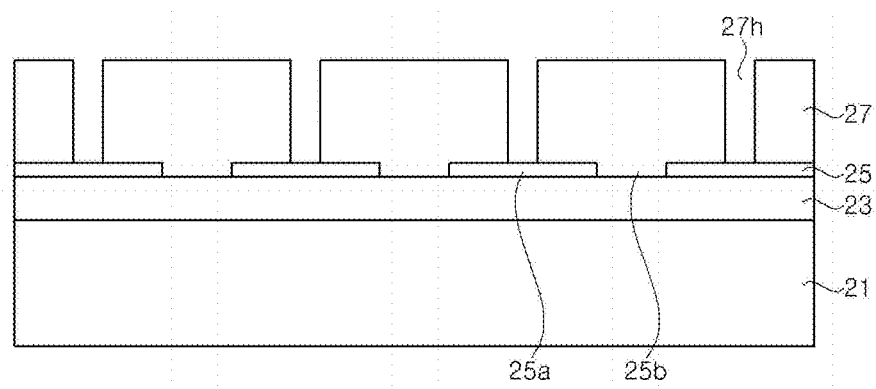
Figure 4:
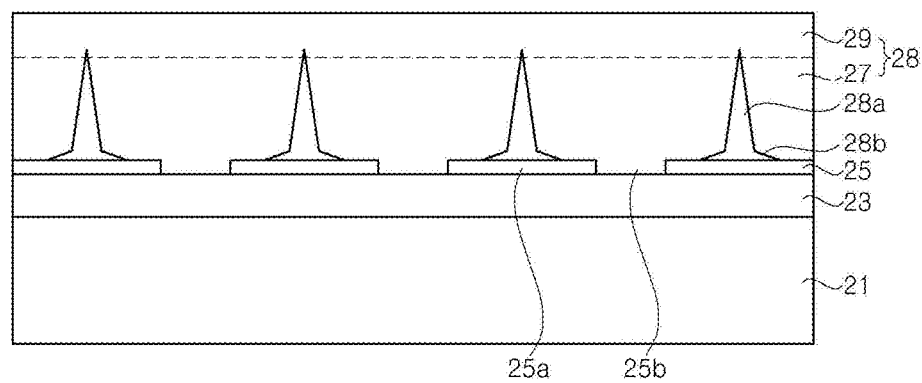

FIG. 2 to FIG. 4 are sectional views illustrating a method of fabricating an epitaxial wafer in accordance with various embodiments of the present invention. Referring to FIG. 2, a lower epitaxial layer 23 may be grown on a growth substrate 21. The growth substrate 21 may be a sapphire substrate, a gallium nitride substrate, an aluminum nitride substrate, a silicon carbide (SiC) substrate, a silicon (Si) substrate, or the like. Particularly, the growth substrate 21 may be a sapphire substrate or a gallium nitride substrate, and may comprise a polar, non-polar, or semi-polar substrate. The lower epitaxial layer 23 may be formed of a gallium nitride-based semiconductor, for example, undoped GaN or n-type GaN, by metal organic chemical vapor deposition (MOCVD) or molecular beam epitaxy (MBE). When the growth substrate 21 is a gallium nitride substrate, the lower epitaxial layer 23 may be omitted.

A mask pattern 25 is formed on the lower epitaxial layer 23. The mask pattern 25 may be formed of, for example, SiO$_2$ or various silicate materials. The mask pattern 25 comprises masking regions 25a and opening regions 25b. Here, the masking regions 25a may have a width from 5 μm to 30 μm, specifically from 10 μm to 30 μm. In addition, the opening regions 25b may have a width of 1 μm to 3 μm.

As shown in FIG. 5(a), the mask pattern 25 may have a stripe shape. In particular, each mask region 25a may include rectangular stripes. Alternatively, as shown in FIG. 5(b), the mask pattern 25 may have a mesh-shaped masking region 25a that includes intersecting stripes extending in different directions.

Figure 7A:
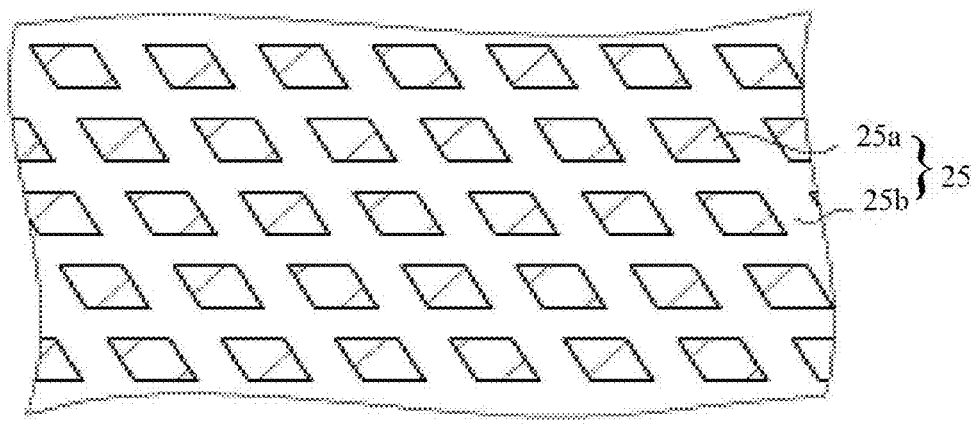

Alternatively, as shown in FIG. 6(a), the mask pattern 25 may include hexagonal masking regions 25a. As shown in FIG. 7(a), the mask pattern 25 may include rhombus-shaped masking regions 25a. In other words, the mask patterns 25 of FIGS. 6(a) and 7(a) may include masking regions 25a disposed in an island pattern.

Figure 7B:
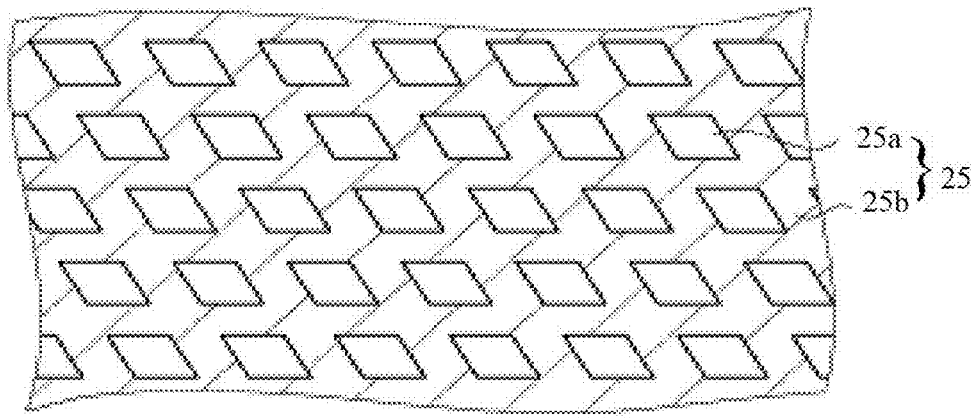

Alternatively, as shown in FIG. 6(b), the mask pattern 25 may include a matrix-shaped masking region 25a and hexagonal opening regions 25b. As shown in FIG. 7(b), the mask pattern 25 may include a matrix-shaped masking region 25a and rhombus-shaped opening regions 25b. Alternatively, the mask pattern 25 may include circular opening regions or circular masking regions.

Referring to FIG. 3, 3D epitaxial layers 27 are grown on the growth substrate 21 having the mask pattern 25, under 3D growth conditions. The 3D epitaxial layers 27 are grown by metal organic chemical vapor deposition (MOCVD), by adjusting the growth temperature, growth pressure, and V/III ratio, under 3D growth conditions, wherein a vertical growth is predominant over lateral growth. Generally, the 3D growth conditions may comprise a relatively lower growth temperature, a relatively higher growth pressure, and a relatively higher V/III ratio. For example, the 3D epitaxial layers 27 may be grown under 3D growth conditions wherein the growth temperature is set to 1030° C., the growth pressure is set to 400 Torr, and the V/III ratio is set to 300.

When the 3D epitaxial layers 27 are grown under the 3D growth conditions, growth of the epitaxial layers 27 starts from the opening regions 25b of the mask pattern 25, and vertical growth becomes predominant over lateral growth. Here, a groove 27h is formed on the masking region 25a, by adjusting the growth thickness to prevent the epitaxial layers 27 from being combined with each other on the masking regions 25a.

Referring to FIG. 4, after the 3D epitaxial layers 27 are grown, an epitaxial layer 28 is formed by growing 2D epitaxial layers 29 under 2D growth conditions, wherein lateral growth is predominant over vertical growth. The 2D growth conditions may have a relatively higher growth temperature, a relatively lower growth pressure, and a relatively lower V/III ratio than the 3D growth conditions. For example, the 2D epitaxial layers 29 may be grown under 2D growth conditions, wherein the growth temperature is set to 1110° C., the growth pressure is set to 150 torr, and the V/III ratio is set to 150.

During growth of the 2D epitaxial layer 29, lateral growth proceeds in the grooves 27h of the 3D epitaxial layer 27. As a result, an upper void 28a, having a conical or pyramidal shape, can be formed within the epitaxial layer 28. In addition, when the epitaxial layer 28 is grown to a relatively large thickness, for example, a thickness of about 10 μm or more, the lower void 28b can be formed between the masking region 25a and the epitaxial layer 28.

After the 3D epitaxial layers 27 are grown under predetermined 3D growth conditions, the growth conditions may be changed to 2D growth conditions, to grow the 2D epitaxial layers 29. However, it should be understood that the present invention is not limited thereto. Alternatively, after the 3D epitaxial layers 27 are grown, the epitaxial layers 29 may be grown while gradually changing the growth conditions from the 3D growth conditions to the 2D growth conditions. By the 2D growth conditions, the epitaxial layers 29 may be combined with each other at the grooves 27h, thereby forming the epitaxial layer 28 having a flat upper surface.

The method of fabricating an epitaxial wafer may further comprise growing a semiconductor stack structure (not shown) on the epitaxial layer 29. The semiconductor stack structure may comprise various semiconductor layers, for example, a gallium nitride semiconductor layer. According to this embodiment, the relatively large voids 28a, 28b may be is formed on the masking regions 25a of the mask pattern 25, using the 3D growth conditions and the 2D growth conditions.

The epitaxial layer 28 can be easily separated from the growth substrate 21 through chemical lift-off or stress lift-off, due to the voids 28a, 28b. When the mask pattern 25 includes a matrix-shaped masking region 25a, the voids 28a, 28b are closed by the epitaxial layer 28 and the masking region 25a. As such, it may be more difficult to achieve penetration of a chemical solution into the voids 28a, 28b. Thus, in this case, stress lift-off can be used to separate the epitaxial layer 28 from the growth substrate 21.

FIG. 8 to FIG. 13 are sectional views illustrating a method of separating a substrate and a method of fabricating a semiconductor device, in accordance with various embodiments of the invention. Referring to FIG. 8 to FIG. 13, the method of separating a substrate and the method of fabricating a semiconductor device may comprise the method of fabricating an epitaxial wafer described with reference to FIG. 1 to FIG. 7. Thus, in this embodiment, the method of separating a substrate and the method of fabricating a semiconductor device will be described using the epitaxial wafer of FIG. 1.

Figure 8:
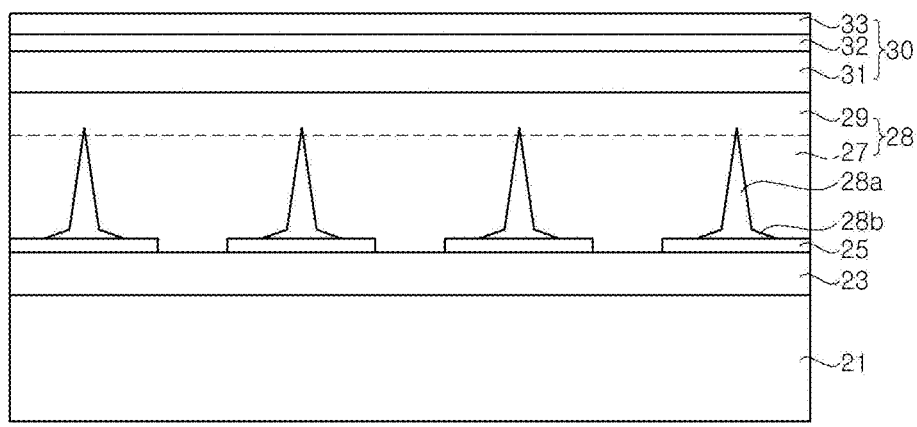
FIGS. 8 to 13 are sectional views illustrating a method of separating a substrate and a method of fabricating a semiconductor device in accordance with an exemplary embodiment of the present invention.

Referring to FIG. 8, a semiconductor stack structure 30 is grown on the epitaxial layer 29. The semiconductor stack structure 30 may comprise a first nitride semiconductor layer 31 and a second nitride semiconductor layer 33, and an active layer 32.

Each of the first nitride semiconductor layer 31 and the second nitride semiconductor layer 33 may be a single layer, but the present disclosure is not limited thereto. Alternatively, each of the first and second semiconductor layers may comprise multiple layers. Such multiple layers may comprise an undoped layer and a doped layer. In addition, the active layer 32 may have a single quantum well structure or a multi-quantum well structure.

The first nitride semiconductor layer 31 may be a nitride semiconductor layer doped with a first conductive type impurity, for example, a III-N based compound semiconductor layer doped with an n-type impurity, such as an (Al, In, Ga)N-based nitride semiconductor layer, and may comprise a gallium nitride layer. In addition, the first nitride semiconductor layer 31 may comprise an undoped layer that is not doped with impurities.

The active layer 32 may be a III-N based compound semiconductor layer, for example, an (Al, Ga, In)N semiconductor layer. The active layer 32 may have a single quantum-well structure or a multi-quantum well structure in which well layers (not shown) and barrier layers (not shown) are alternately stacked one above another.

The second nitride semiconductor layer 33 may be a III-N based compound semiconductor layer doped with a second conductive type impurity. The second nitride semiconductor layer 33 may comprise, for example, a P-type impurity, such as an (Al, Ga, In)N-based group-III nitride semiconductor layer, and may comprise, for example, a GaN layer.

Figure 9:
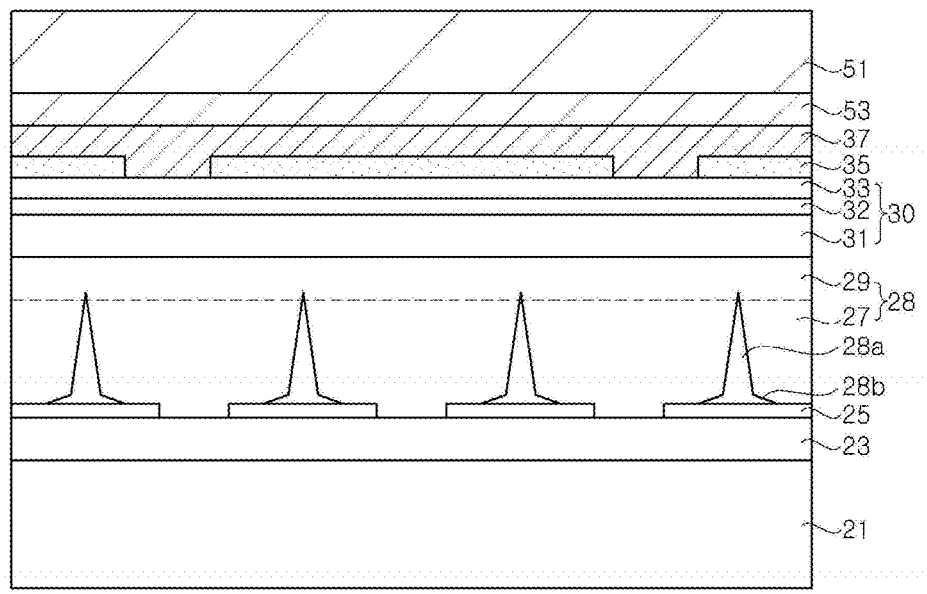

Referring to FIG. 9, a support substrate 51 is attached to the semiconductor stack structure 30. The support substrate 51 may be bonded to the semiconductor stack structure 30 via a bonding metal layer 53. On the other hand, before bonding the support substrate 51, a reflective metal layer 35 and a barrier metal layer 37 may be formed on the semiconductor stack structure 30. The reflective metal layer 35 may comprise, for example, Ag or Al, and the barrier metal layer 37 may comprise Ni. The reflective metal layer 35 is electrically connected to the second nitride semiconductor layer 33 and improves luminous efficiency, by reflecting light generated in the active layer 32. The barrier metal layer 37 covers and protects the reflective metal layer 35.

Since the epitaxial layer 28 has the relatively large voids 28a, 28b, there is no need for the formation of device dividing regions for providing a chemical path. Accordingly, the reflective metal layer 35 and the barrier metal layer 37 may be formed over the semiconductor stack structure 30, without dividing the semiconductor stack structure 30.

Figure 10:
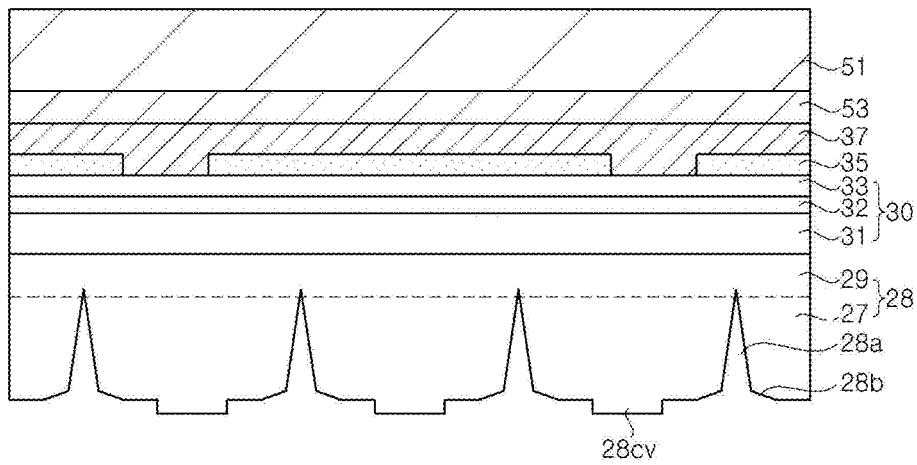

Referring to FIG. 10, the growth substrate 21 is separated from the epitaxial layer 28. The growth substrate 21 may be separated from the epitaxial layer 28 by stress lift-off using stress application or by chemical lift-off using a chemical solution.

Particularly, the support substrate 51 may be formed of a material having a different coefficient of thermal expansion, for example, a coefficient of thermal expansion of 5.5/K to 7.5/K, than that of the growth substrate 21. For example, the support substrate 51 may be formed of MoCu or CuW. Accordingly, after the support substrate 51 is bonded to the semiconductor stack structure, the growth substrate 21 may be separated at the voids 28a, 28b from the epitaxial layer 28, by the difference in the coefficients of thermal expansion of the support substrate 51 and the growth substrate 21.

Alternatively, after the mask pattern 25 is removed using HF or BOE, the growth substrate 21 may be separated from the epitaxial layer 28 by applying stress to the voids. The growth substrate 21 is separated together with the lower epitaxial layer 23 from the epitaxial layer 28. Thus, the epitaxial layer 28 having the voids 28a, 28b is exposed.

Figure 11:
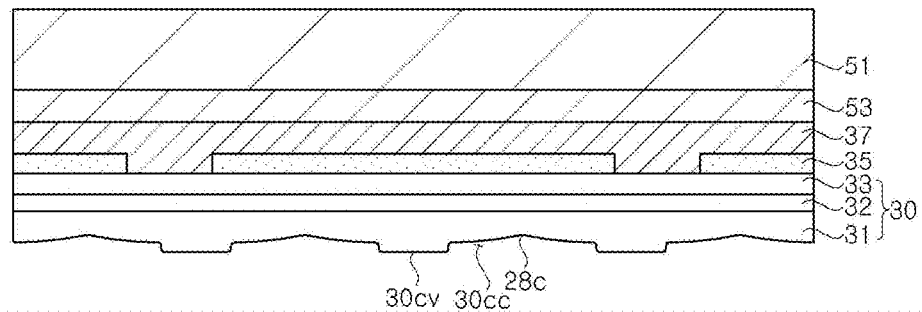

Referring to FIG. 11, the exposed epitaxial layer 28 is planarized to expose the semiconductor stack structure 30. The epitaxial layer 28 may be planarized by dry etching. For example, while supplying $BCl_3$ gas at a flux of 35~45 sccm, primary etching is performed under conditions of a process pressure of about 5 mTorr and an RF power of about 500 W, to etch bump sections 28cv at a higher etching rate than recessed portions. Then, while $BCl_3$ and $Cl_2$ are supplied at a flux of about 5 to 6 sccm and a flux of about 20 to 25 sccm, respectively, secondary is etching is performed under conditions of a process pressure of about 5 mTorr and an RF power of about 300 W, to etch the epitaxial layer 28. By such primary etching and secondary etching stages, it is possible to prevent the shapes of the voids 28a, 28b from being transferred to the semiconductor stack structure 30.

By dry etching, protrusions 30cv and recesses 30cc are formed on a surface of the semiconductor stack structure 30. The protrusions 30cv generally correspond to the bump sections 28cv of the epitaxial layer 28, and the recesses 30cc generally correspond to sections, from which the mask pattern 25 is removed. In addition, the protrusions 30cv may correspond to sections on which the epitaxial layer 28 remains. On the other hand, a sub-recess 28c may be formed in the recess 30cc. The sub-recess 28c may have a sharp (highly angular) shape.

Figure 12:
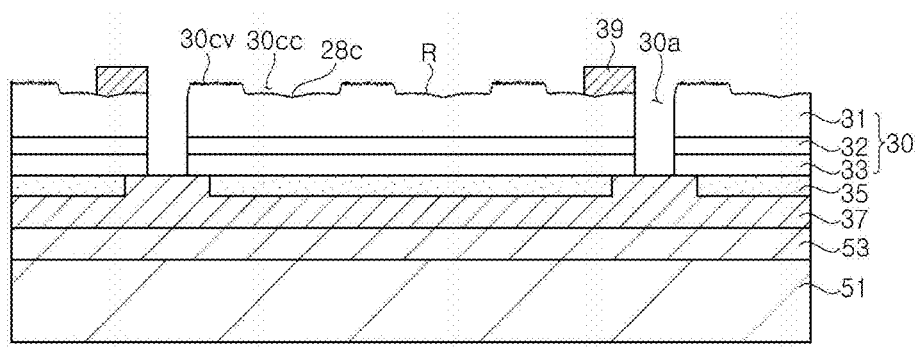

Referring to FIG. 12, a device dividing groove 30a is formed to divide the semiconductor stack structure 30 into device regions. In addition, rough surface areas R may be formed on the surface of semiconductor stack structure 30 by photo enhanced chemical etching and the like. The rough surface areas R may be formed on surfaces of the protrusions 30cv and the recesses 30cc. Since the rough surface areas R are formed together with the protrusions 30cv and the recesses 30cc, extraction efficiency of light generated in the active layer 32 is improved.

The rough surface areas R may be formed after forming the device dividing groove 30a. Alternatively, the device dividing groove 30a may be formed after forming the rough surface areas R. Then, an electrode 39 is formed in each of device regions. The electrode 39 is electrically connected to the first nitride semiconductor layer 31 of the semiconductor stack structure 30.

Figure 13:
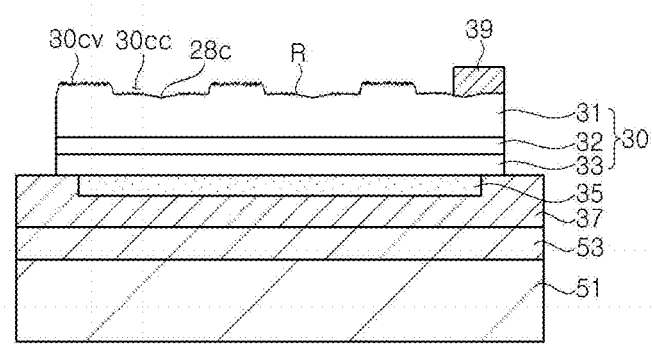

Referring to FIG. 13, the support substrate 51 is divided along the device dividing groove 30a, thereby providing a semiconductor device, for example, a light emitting diode. The support substrate 51 may be separated therefrom by laser scribing.

The voids 28a, 28b may be formed on each of the masking regions 25a of the mask pattern 25, by epitaxial growth, and the growth substrate 21 can be easily separated from the epitaxial layer 28 using the voids 28a, 28b. Accordingly, the growth substrate 21 can be separated from the epitaxial layer 28 without dividing the semiconductor stack structure 30. Accordingly, loss of the semiconductor stack structure 30 can be reduced, thereby improving yield of semiconductor devices.

For example, the masking regions 25a may be removed by supplying a chemical solution, such as HF or BOE, through the upper and lower voids 28a, 28b. As such, the epitaxial layer 28 can be easily separated from the growth substrate 21. In addition, since coupling force between the epitaxial layer 28 and the mask pattern 25 is weakened due to the upper and lower voids 28a, 28b, the epitaxial layer 28 can be easily separated from the growth substrate 21 by applying stress thereto. Furthermore, since the lower void 28b is formed in a sharp shape between the masking region 25a and the epitaxial layer 28, the epitaxial layer 28 can be easily separated from the masking region 25a by applying stress to an interface therebetween.

Figure 14:
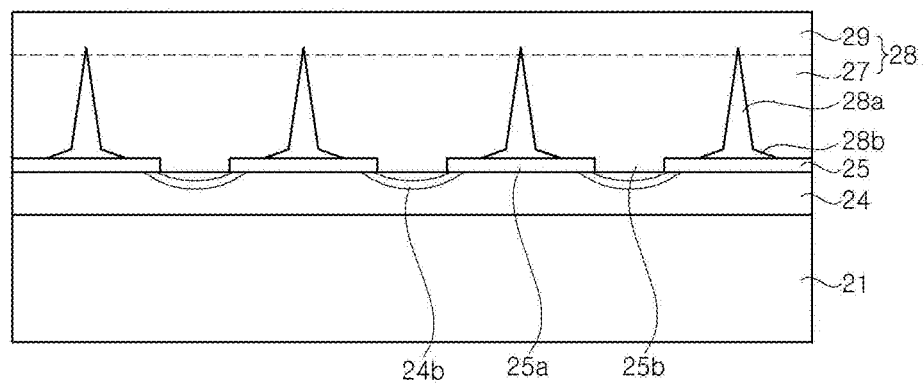
FIG. 14 is a sectional view of an epitaxial wafer in accordance with an exemplary embodiment of the present invention.

FIG. 14 is a sectional view of an epitaxial wafer in accordance with another embodiment of the invention. Referring to FIG. 14, the epitaxial wafer is generally similar to the epitaxial layer of FIG. 1, and further comprises a first void 24 under the opening region 25b of the mask pattern 25.

In this embodiment, the mask pattern 25 is disposed on an n-type gallium nitride-based sacrificial layer 24. The mask pattern 25 is generally similar to the mask pattern described with reference to FIG. 1, except that the opening region 25b of the mask pattern 25 has a size of greater than 3 μm.

A first void 24b is disposed below the mask pattern 25, and a portion of the first void 24b may extend under the masking region 25a. The first void 24b is formed together with the voids 28a, 28b. As such, the epitaxial layer 28 can be more easily separated from the growth substrate 21 by chemical lift-off or stress lift-off.

Figure 15:
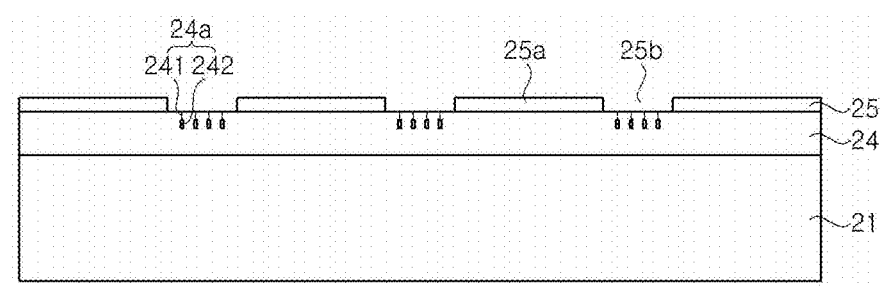
FIGS. 15 to 17 are sectional views illustrating a method of fabricating an epitaxial wafer, a method of separating a substrate, and a method of fabricating a semiconductor device, in accordance with an exemplary embodiment of the present invention.
Figure 16:
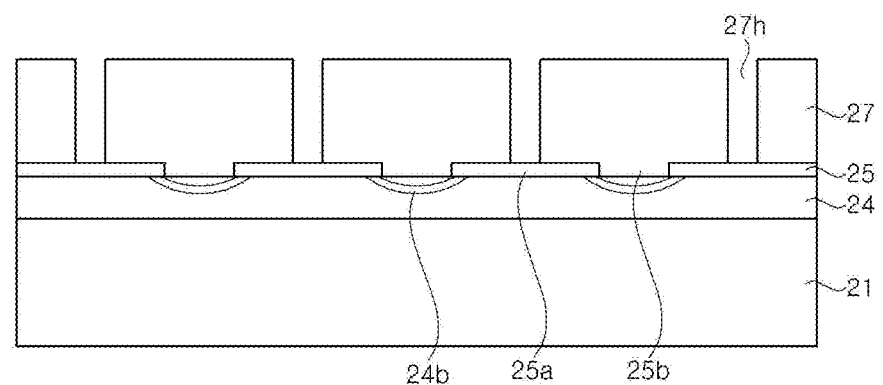
Figure 17:
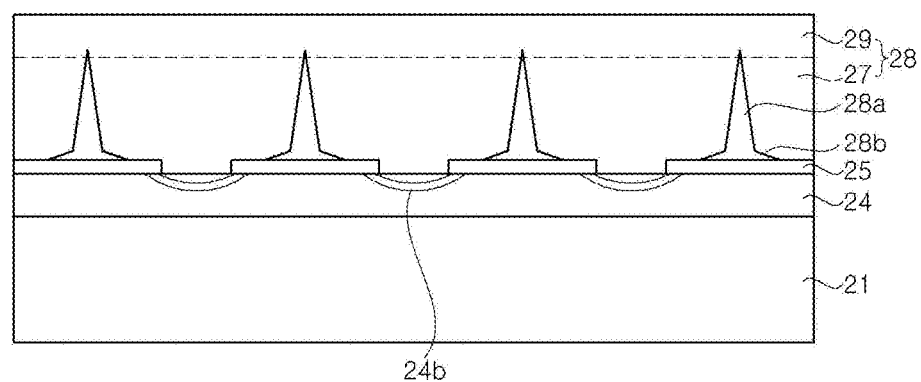

FIG. 15 to FIG. 17 are sectional views illustrating a method of fabricating an epitaxial wafer, a method of separating a substrate, and a method of fabricating a semiconductor device, in accordance with various embodiment of the present invention. The method of fabricating an epitaxial wafer is generally similar to the method described with reference to FIG. 2 to FIG. 4, and thus, characteristic differences of the method according to this embodiment will be focused upon hereinafter.

First, referring to FIG. 15, a gallium nitride-based sacrificial layer 24 is grown on a growth substrate 21. The sacrificial layer 24 may be grown on the growth substrate 21 by, for example, MOCVD, MBE, and the like. The sacrificial layer 24 may be an n-type gallium nitride-based semiconductor layer, for example, a GaN layer doped with a relatively high density of impurities, for example, $1 \times 10^{17} \sim 1 \times 10^{19}$ Si atoms/$cm^3$. Before forming the sacrificial layer 24, an undoped gallium nitride-based semiconductor layer, like the lower epitaxial layer 23 as shown in FIG. 2, may be grown on the growth substrate 21.

A mask pattern 25 is formed on the sacrificial layer 24. The mask pattern 25 may be formed as described with reference to FIG. 2. In this embodiment, opening regions 25b of the mask pattern 25 may have a greater width than the opening regions 25b of FIG. 2.

Next, the sacrificial layer 24 exposed through the opening regions 25b of the mask pattern 25 is partially etched by electrochemical etching, to form fine pores 24a in the sacrificial layer 24. For electrochemical etching, the growth substrate 21 having the sacrificial layer 24 thereon is dipped together with a negative electrode (for example, a Pt electrode) into an ECE solution. Then, a positive voltage is applied to the sacrificial layer 24 and a negative voltage is applied to the negative electrode. The size of the fine pores 24a may be adjusted by adjusting the molarity of the ECE solution, process time, and applied voltage. The ECE solution may be an electrolyte solution, for example, an electrolyte solution containing oxalic acid, HF, or NaOH.

The sacrificial layer 24 may be partially removed by a single stage electrochemical etching (ECE), in which a constant voltage, for example, a voltage ranging from 10V to 60V, is continuously applied. However, the present invention is not limited thereto. For example, the sacrificial layer 24 may be partially removed by two-stage electrochemical etching (ECE), in which a relatively low voltage is initially applied, and a relatively high voltage is then applied. FIG. 15 shows fine pores 241, 242 formed by two-stage electrochemical etching. The fine pores 241 have a relatively smaller size and are formed in the first stage, in which a relatively low voltage is applied. The fine pores 242 have a relatively larger size are formed in the second stage, in which a relatively high voltage is applied. For example, electrochemical etching is performed using a 0.3M oxalic acid solution at 20° C., by applying a voltage of 8 V to 9 V in the first stage and a voltage of 15V to 17 V in the second stage, to the GaN sacrificial layer 24 having a Si doping density of $6 \times 10^{18}/cm^3$.

With two-stage electrochemical etching, the surface of the n-type gallium nitride-based sacrificial layer 24 can maintain relatively good crystallinity, and relatively large fine pores 242 can be formed in the n-type gallium nitride-based sacrificial layer 24, thereby providing advantageous conditions for subsequent processes.

Referring to FIG. 16, 3D epitaxial layers 27 are grown as described with reference to FIG. 3, using the sacrificial layer 24 as a seed. During growth of the 3D epitaxial layers 27, the fine pores 24a are combined and grown to form a first void 24b. The first void 24b is formed below each of the opening regions 25b of the mask pattern 25 to connect adjacent masking regions 25a to each other.

Referring to FIG. 17, as described with reference to FIG. 4, 2D epitaxial layers 29 are grown on the 3D epitaxial layers 27 to form an epitaxial layer 28 covering the mask pattern 25. In addition, a semiconductor stack structure (not shown) may be grown on the epitaxial layer 28.

In addition to the voids 28a, 28b in the embodiment described with reference to FIG. 2 to FIG. 4, the first void 24b is formed below the opening region 25b of the mask pattern 25. Accordingly, the epitaxial layer 28 can be more easily separated from the growth substrate 21 by chemical lift-off or stress lift-off. Further, since the first void 24b is formed below the opening region 25b, the opening region 25b may be formed to a relatively large width.

Then, individual semiconductor devices, for example, light emitting diodes, may be fabricated by the substrate separation method and the semiconductor device fabrication method as described with reference to FIG. 8 to FIG. 13.

Figure 18:
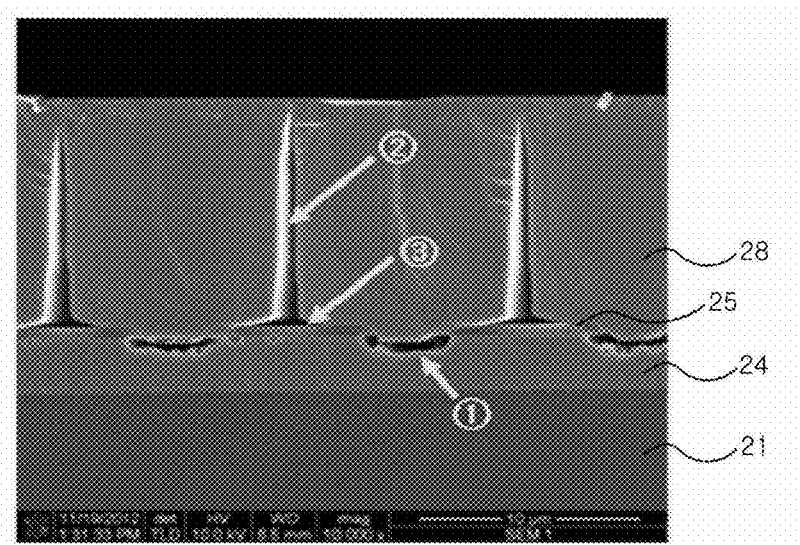
FIG. 18 is an SEM image of an epitaxial wafer in accordance with an exemplary embodiment of the present invention.

FIG. 18 shows an SEM image of a cross-section of the epitaxial wafer described with reference to FIG. 14 to FIG. 17. Here, the growth substrate 21 was a sapphire substrate, the sacrificial layer 24 was an n-type GaN layer, and the mask pattern 25 was formed of $SiO_2$. The sacrificial layer was etched by two-stage ECE. In addition, the 3D epitaxial layer was grown for 60 minutes under a growth temperature of 1030° C., a growth pressure of 400 Torr, and a VIII ratio of 300. After completion of 3D growth under the 3D conditions, an epitaxial layer 28 was grown by gradually changing the temperature, pressure, and V/III, until desired 2D growth conditions could be obtained. Here, in the 2D growth conditions, the growth temperature was 1110° C., the growth pressure was 150 Torr, and the V/III ratio was 150.

In FIG. 18, it can be confirmed that a first void (1) is formed under each of the opening region of the mask pattern 25, and a second void (2) and a third void (3) are formed on the masking region of the mask pattern 25. In addition, it can be seen that the second void (2) and the third void (3) have larger volumes than the first void (1) formed by ECE. Accordingly, the epitaxial layer 28 can be easily separated from the growth substrate 21 using the second (2) and third voids (3).

FIGS. 19(a) and 19(b) are SEM images of a top surface and a cross-section of an epitaxial layer, after separating a growth substrate 21 from the epitaxial layer 28 described with reference to FIG. 14 to FIG. 17. FIGS. 20(a) and 20(b) are SEM images of a top surface and a cross-section of an epitaxial layer 29 of FIGS. 19(a) and 19(b), illustrating surface morphology after dry etching of the epitaxial layer, by two-stage etching as described with reference to FIG. 11.

Figure 19:
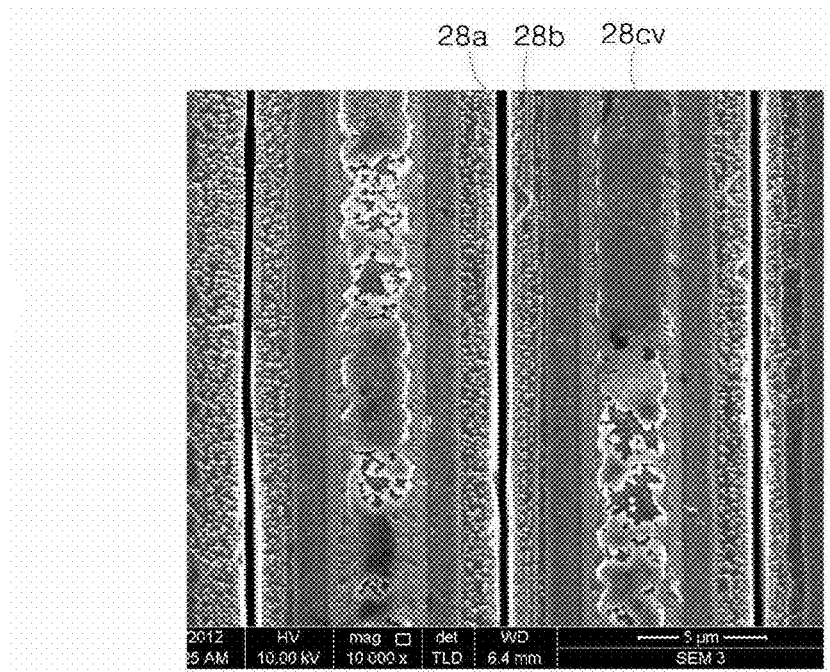
FIGS. 19(a) and 19(b) are SEM images of a top surface and a cross-section of an epitaxial layer after separating a growth substrate in accordance with an exemplary embodiment of the present invention.
Figure 19:
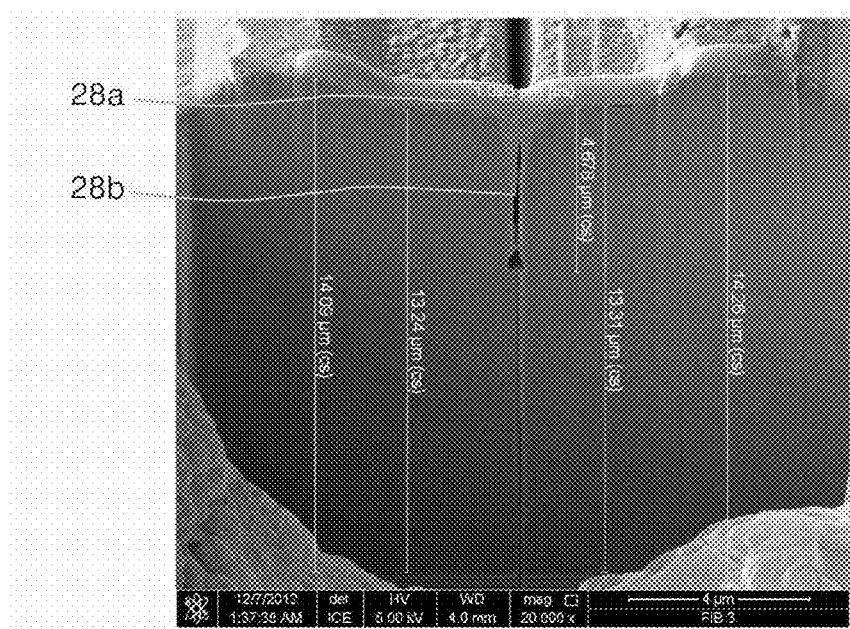

Referring to FIGS. 19 (a) and (b), after the growth substrate 21 is separated, bump sections 28cv and voids 28a, 28b are observed on the surface of the epitaxial layer 28. The bump sections 28cv correspond to sections on which the epitaxial layer 28 formed on the opening regions 25b of the mask pattern 25 remains after the mask pattern 25 is removed.

Figure 20:
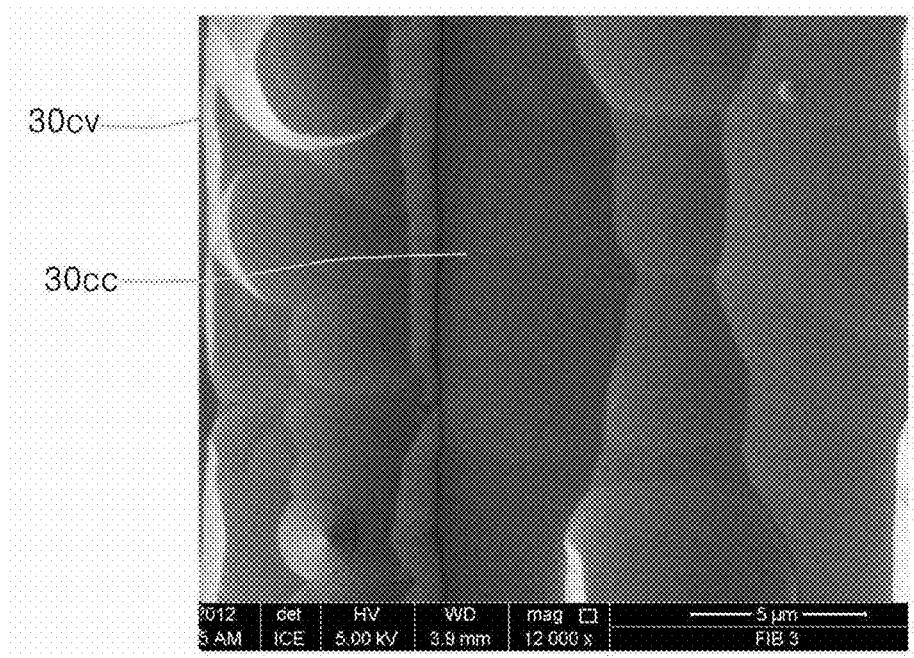
FIGS. 20(a) and 20(b) are SEM images of a top surface and a cross-section of an epitaxial layer, illustrating surface morphology after dry etching of the epitaxial in accordance with an exemplary embodiment of the present invention.
Figure 20:
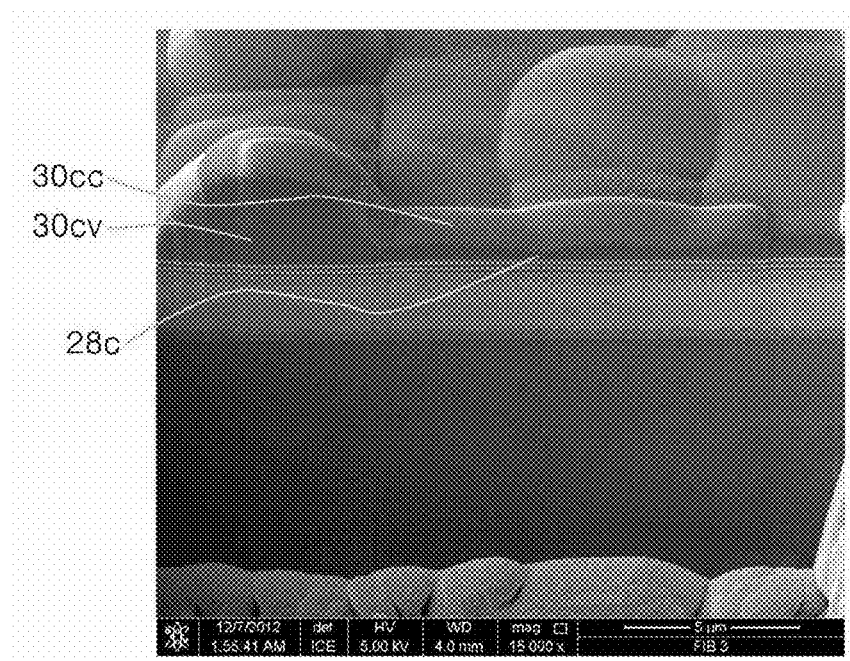

Referring to FIGS. 20 (a) and (b), protrusions 30cv and recesses 30cc were observed on the surface of the epitaxial layer 28 after dry etching, and sub-recesses 28c were also observed within the recesses 30cc. The protrusions 30cv correspond to the bump sections 28cv described above, and the recesses 30cc generally correspond to locations of the voids 28a, 28b.

It can be confirmed that the voids 28a, 28b substantially disappear within the is recesses 30c after dry etching, and the surfaces thereof are relatively planarized. In addition, as compared with the bump sections 28cv having a stripe shape, the protrusions 30cv are relatively irregularly formed. In other words, a portion at a location corresponding to the bump section 28cv is etched substantially to the same level as that of the recess 30cc. Thus, the protrusions 30cv are intermittently observed. As a result, with the first and second etching processes, the epitaxial layer 28 having the voids 28a, 28b can be planarized by dry etching.

The exemplary embodiments of the invention provide an epitaxial wafer having large voids between the growth substrate and the epitaxial layer, to allow application of chemical lift-off or stress lift-off, and methods of fabricating the same. In addition, the voids may be formed between the growth substrate and the epitaxial layer using conditions for growth of the epitaxial layer.

In addition, according to the exemplary embodiments of the invention, relatively large voids may be formed between the growth substrate and the epitaxial layer using a technique of growing the epitaxial layer, and may be used to separate the growth substrate through chemical lift-off or stress lift-off. Particularly, the growth substrate may be separated from the epitaxial layer using a difference in coefficient of thermal expansion between the support substrate and the growth substrate without dividing the grown epitaxial layer.

Furthermore, embodiments of the present invention may provide a light emitting diode having improved light extraction efficiency using the shape of the epitaxial layer.

Although the invention has been illustrated with reference to some embodiments in conjunction with the drawings, it will be apparent to those skilled in the art that various modifications and changes can be made to the invention without departing from the spirit and scope of the invention. Further, it should be understood that some features of a certain embodiment may also be applied to other embodiments without departing from the spirit and scope of the invention. Therefore, it should be understood that the embodiments are provided by way of illustration only and are given to provide complete disclosure of the invention and to provide thorough understanding of the invention to those skilled in the art. Thus, it is intended that the invention cover the modifications and variations provided they fall within the scope of the appended claims and their equivalents.

What is claimed is:

1. An epitaxial wafer, comprising:
a growth substrate;
a mask pattern disposed on the growth substrate and comprising a masking region and an opening region; and
an epitaxial layer covering the mask pattern and comprising a first void disposed on the masking region,
wherein the first void comprises:
a lower void disposed between a lower surface of the epitaxial layer and the masking region; and
an upper void extending from the lower void into the epitaxial layer,
wherein the lower void has a greater width than the upper void.

2. The epitaxial wafer of claim 1, wherein:
the mask pattern comprises masking regions;
the epitaxial layer comprises voids; and
each of the voids is disposed over, and within the perimeter of, a corresponding one of the masking regions.

3. The epitaxial wafer of claim 1, wherein the masking region has a width in a range of 5 µm to 30 µm.

4. The epitaxial wafer of claim 3, wherein the masking region has a width in a range of 10 µm to 30 µm.

5. The epitaxial wafer of claim 1, wherein the opening region has a width in a range of 1 µm to 3 µm.

6. The epitaxial wafer of claim 5, further comprising an n-type gallium nitride-based sacrificial layer disposed between the mask pattern and the growth substrate,
wherein the sacrificial layer comprises a second void disposed below the opening region of the mask pattern.

7. The epitaxial wafer of claim 1, further comprising a gallium nitride-based sacrificial layer disposed between the mask pattern and the growth substrate,
wherein the sacrificial layer comprises a second void disposed directly between the opening region of the mask pattern and the growth substrate.

8. The epitaxial wafer of claim 1, wherein the epitaxial layer has a substantially flat upper surface.

9. The epitaxial wafer of claim 1, further comprising a semiconductor stack disposed on the epitaxial layer.

10. The epitaxial wafer of claim 1, wherein the growth substrate comprises gallium nitride.

11. The epitaxial wafer of claim 2, wherein the masking regions are disposed in an island pattern.

* * * * *